United States Patent
Park et al.

(10) Patent No.: US 10,320,423 B2
(45) Date of Patent: *Jun. 11, 2019

(54) BIT INTERLEAVER FOR LOW-DENSITY PARITY CHECK CODEWORD HAVING LENGTH OF 64800 AND CODE RATE OF 2/15 AND 64-SYMBOL MAPPING, AND BIT INTERLEAVING METHOD USING SAME

(71) Applicant: Electronics and Telecommunications Research Institute, Daejeon (KR)

(72) Inventors: Sung-Ik Park, Daejeon (KR);
Sun-Hyoung Kwon, Daejeon (KR);
Jae-Young Lee, Daejeon (KR);
Heung-Mook Kim, Daejeon (KR);
Nam-Ho Hur, Sejong (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/424,192

(22) Filed: Feb. 3, 2017

(65) Prior Publication Data

US 2017/0149454 A1    May 25, 2017

Related U.S. Application Data

(63) Continuation of application No. 14/626,272, filed on Feb. 19, 2015, now Pat. No. 9,602,138.

(30) Foreign Application Priority Data

Feb. 12, 2015 (KR) .......................... 10-2015-0021507

(51) Int. Cl.
| | |
|---|---|
| H03M 13/00 | (2006.01) |
| H03M 13/27 | (2006.01) |
| H03M 13/11 | (2006.01) |
| H03M 13/25 | (2006.01) |
| H04L 1/00 | (2006.01) |

(52) U.S. Cl.
CPC ... *H03M 13/2792* (2013.01); *H03M 13/1102* (2013.01); *H03M 13/1148* (2013.01); *H03M 13/1165* (2013.01); *H03M 13/255* (2013.01); *H03M 13/2778* (2013.01);
(Continued)

(58) Field of Classification Search
CPC .......... H03M 13/255; H03M 13/2778; H03M 13/116; H03M 13/1185; G06F 11/1076
See application file for complete search history.

(56) References Cited

U.S. PATENT DOCUMENTS 9,553,609 B2 * 1/2017 Park ...................... H04L 1/0076
9,577,674 B2 * 2/2017 Park .................... H03M 13/1165
(Continued)

*Primary Examiner* — Guy J LaMarre

(57) ABSTRACT

A bit interleaver, a bit-interleaved coded modulation (BICM) device and a bit interleaving method are disclosed herein. The bit interleaver includes a first memory, a processor, and a second memory. The first memory stores a low-density parity check (LDPC) codeword having a length of 64800 and a code rate of 2/15. The processor generates an interleaved codeword by interleaving the LDPC codeword on a bit group basis. The size of the bit group corresponds to a parallel factor of the LDPC codeword. The second memory provides the interleaved codeword to a modulator for 64-symbol mapping.

2 Claims, 6 Drawing Sheets

(52) U.S. Cl.
CPC .......... *H04L 1/0041* (2013.01); *H04L 1/0045* (2013.01); *H04L 1/0058* (2013.01); *H04L 1/0071* (2013.01)

(56) References Cited

U.S. PATENT DOCUMENTS

| | | | | |
|---|---|---|---|---|
| 9,577,681 B2 * | 2/2017 | Park | ................... | H03M 13/2792 |
| 9,602,138 B2 * | 3/2017 | Park | ................... | H03M 13/2792 |
| 2004/0086059 A1 | 5/2004 | Eroz et al. | | |
| 2004/0153934 A1 * | 8/2004 | Jin | ..................... | H03M 13/1102 |
| | | | | 714/746 |
| 2011/0075710 A1 | 3/2011 | Park et al. | | |
| 2011/0167317 A1 | 7/2011 | Kim et al. | | |
| 2013/0290816 A1 * | 10/2013 | Shinohara | ............. | H04L 1/0058 |
| | | | | 714/776 |
| 2015/0214982 A1 * | 7/2015 | Park | ........................ | H04L 27/20 |
| | | | | 714/752 |
| 2015/0236720 A1 * | 8/2015 | Park | .................... | H03M 13/116 |
| | | | | 714/752 |
| 2015/0236722 A1 * | 8/2015 | Park | .................... | H03M 13/036 |
| | | | | 714/776 |
| 2015/0256202 A1 * | 9/2015 | Park | ................... | H03M 13/1165 |
| | | | | 714/762 |
| 2015/0270854 A1 * | 9/2015 | Park | .................... | H03M 13/036 |
| | | | | 714/776 |
| 2015/0280747 A1 * | 10/2015 | Park | .................. | H03M 13/2778 |
| | | | | 714/752 |
| 2015/0339190 A1 * | 11/2015 | Park | ................... | H03M 13/1102 |
| | | | | 714/766 |
| 2015/0339191 A1 * | 11/2015 | Park | ..................... | G06F 11/1076 |
| | | | | 714/766 |
| 2015/0341047 A1 * | 11/2015 | Park | ..................... | G06F 11/1076 |
| | | | | 714/766 |
| 2015/0341048 A1 * | 11/2015 | Park | ................... | H03M 13/1102 |
| | | | | 714/766 |
| 2016/0211945 A1 * | 7/2016 | Park | ....................... | H04L 1/0076 |
| 2016/0211947 A1 * | 7/2016 | Park | ....................... | H04L 1/0076 |
| 2016/0241264 A1 * | 8/2016 | Park | ................... | H03M 13/2792 |
| 2016/0241266 A1 * | 8/2016 | Park | ................... | H03M 13/1165 |
| 2017/0093431 A1 * | 3/2017 | Park | ................... | H03M 13/1165 |
| 2017/0117922 A1 * | 4/2017 | Park | ................... | H03M 13/2792 |
| 2017/0126252 A1 * | 5/2017 | Park | ................... | H03M 13/2792 |

* cited by examiner

BIT INTERLEAVER FOR LOW-DENSITY PARITY CHECK CODEWORD HAVING LENGTH OF 64800 AND CODE RATE OF 2/15 AND 64-SYMBOL MAPPING, AND BIT INTERLEAVING METHOD USING SAME

CROSS-REFERENCE TO RELATED APPLICATIONS

This application is a continuation of and claims priority to U.S. application Ser. No. 14/626,272 filed Feb. 19, 2015 and now issued as U.S. Pat. No. 9,602,138, which claims the benefit of Korean Patent Application No. 10-2015-0021507, filed Feb. 12, 2015, which is hereby incorporated by reference herein in its entirety.

BACKGROUND

1. Technical Field

The present disclosure relates generally to an interleaver and, more particularly, to a bit interleaver that is capable of distributing burst errors occurring in a digital broadcast channel.

2. Description of the Related Art

Bit-Interleaved Coded Modulation (BICM) is bandwidth-efficient transmission technology, and is implemented in such a manner that an error-correction coder, a bit-by-bit interleaver and a high-order modulator are combined with one another.

BICM can provide excellent performance using a simple structure because it uses a low-density parity check (LDPC) coder or a Turbo coder as the error-correction coder. Furthermore, BICM can provide high-level flexibility because it can select modulation order and the length and code rate of an error correction code in various forms. Due to these advantages, BICM has been used in broadcasting standards, such as DVB-T2 and DVB-NGH, and has a strong possibility of being used in other next-generation broadcasting systems.

However, in spite of those advantages, BICM suffers from the rapid degradation of performance unless burst errors occurring in a channel are appropriately distributed via the bit-by-bit interleaver. Accordingly, the bit-by-bit interleaver used in BICM should be designed to be optimized for the modulation order or the length and code rate of the error correction code.

SUMMARY

At least one embodiment of the present invention is directed to the provision of an intra-BICM bit interleaver that can effectively distribute burst errors occurring in a broadcasting system channel.

At least one embodiment of the present invention is directed to the provision of a bit interleaver that is optimized for an LDPC coder having a length of 64800 and a code rate of 2/15 and a modulator performing 64-symbol mapping and, thus, can be applied to next-generation broadcasting systems, such as ATSC 3.0.

In accordance with an aspect of the present invention, there is provided a bit interleaver, including a first memory configured to store a low-density parity check (LDPC) codeword having a length of 64800 and a code rate of 2/15; a processor configured to generate an interleaved codeword by interleaving the LDPC codeword on a bit group basis, the size of the bit group corresponding to a parallel factor of the LDPC codeword; and a second memory configured to provide the interleaved codeword to a modulator for 64-symbol mapping.

The 64-symbol mapping may be NUC (Non-Uniform Constellation) symbol mapping corresponding to 64 constellations (symbols).

The parallel factor may be 360, and each of the bit groups may include 360 bits.

The LDPC codeword may be represented by ($u_0$, $u_1$, ..., $u_{N_{ldpc}-1}$) (where $N_{ldpc}$ is 64800), and may be divided into 180 bit groups each including 360 bits, as in the following equation:

$$X_j = \{u_k | 360 \times j \leq k < 360 \times (j+1), 0 \leq k < N_{ldpc}\} \text{ for } 0 \leq j < N_{group}$$

where $X_j$ is an j-th bit group, $N_{ldpc}$ is 64800, and $N_{group}$ is 180.

The interleaving may be performed using the following equation using permutation order:

$$Y_j = X_{\pi(j)}\ 0 \leq j \leq N_{group}$$

where $X_j$ is the j-th bit group, $Y_j$ is an interleaved j-th bit group, and $\pi(j)$ is a permutation order for bit group-based interleaving (bit group-unit interleaving).

The permutation order may correspond to an interleaving sequence represented by the following equation:

interleaving sequence={57 149 83 142 29 20 30 52
5 100 156 22 130 167 121 126 137 158 132 82
138 128 89 88 162 32 107 3 97 166 125 129 1
6 68 148 40 87 0 80 49 24 78 101 43 112 75
172 23 154 12 146 19 135 48 170 123 147 95
91 13 35 127 61 60 139 44 59 55 109 157 177
153 165 66 152 77 98 131 11 81 62 175 141
171 51 155 76 150 174 58 143 37 63 31 41
140 118 94 27 10 70 56 93 176 124 151 106
46 163 179 4 18 144 178 161 145 71 114 7
105 133 84 86 17 21 28 54 74 65 110 122 169
64 111 119 42 85 73 8 116 79 120 69 53 115
67 104 16 173 92 15 159 134 99 96 117 38 9
26 164 47 103 113 136 168 102 14 45 72 25
50 34 36 90 160 2 33 39 108}

In accordance with another aspect of the present invention, there is provided a bit interleaving method, including storing an LDPC codeword having a length of 64800 and a code rate of 2/15; generating an interleaved codeword by interleaving the LDPC codeword on a bit group basis corresponding to the parallel factor of the LDPC codeword; and outputting the interleaved codeword to a modulator for 64-symbol mapping.

In accordance with still another aspect of the present invention, there is provided a BICM device, including an error-correction coder configured to output an LDPC codeword having a length of 64800 and a code rate of 2/15; a bit interleaver configured to interleave the LDPC codeword on a bit group basis corresponding to the parallel factor of the LDPC codeword and output the interleaved codeword; and a modulator configured to perform 64-symbol mapping on the interleaved codeword.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION

Figure 1:
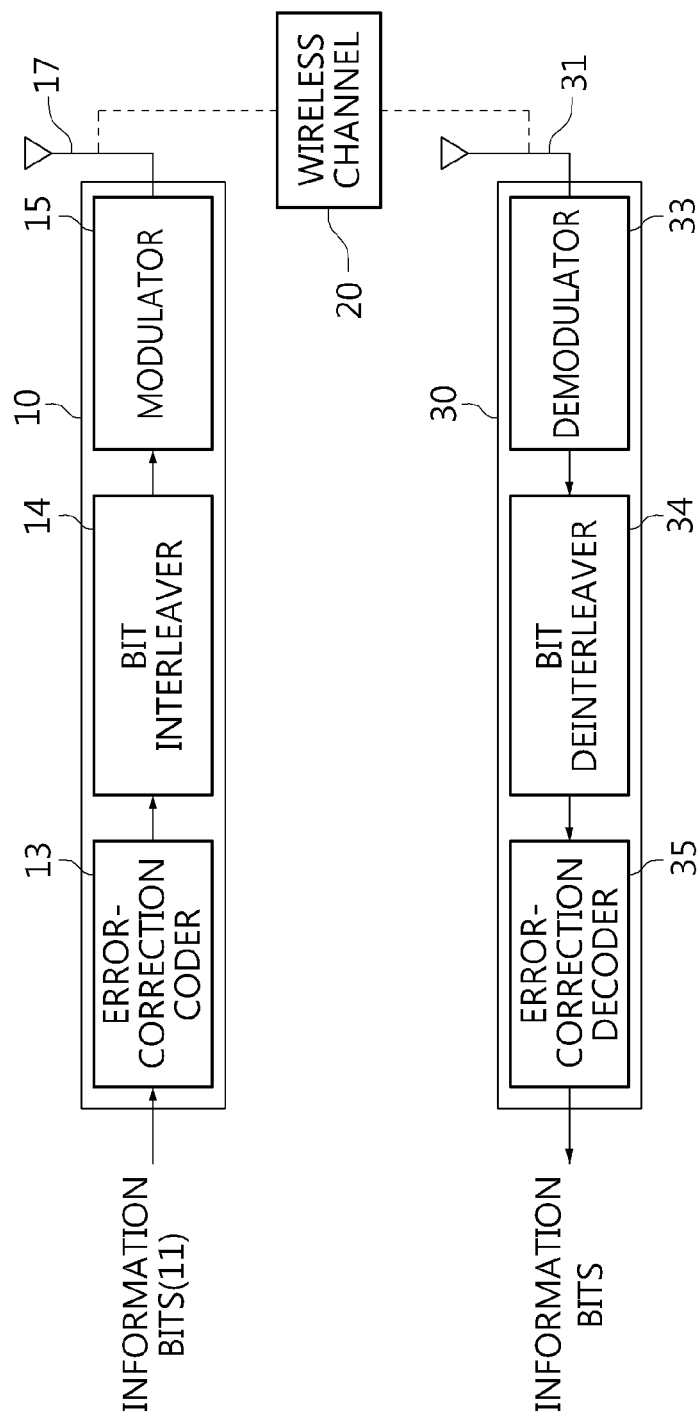
FIG. 1 is a block diagram illustrating a broadcast signal transmission and reception system according to an embodiment of the present invention.

Embodiments of the present invention will be described in detail below with reference to the accompanying drawings. Repeated descriptions and descriptions of well-known functions and configurations that have been deemed to make the gist of the present invention unnecessarily obscure will be omitted below. The embodiments of the present invention are intended to fully describe the present invention to persons having ordinary knowledge in the art to which the present invention pertains. Accordingly, the shapes, sizes, etc. of components in the drawings may be exaggerated to make the description obvious.

Embodiments of the present invention will be described in detail below with reference to the accompanying drawings.

FIG. 1 is a block diagram illustrating a broadcast signal transmission and reception system according to an embodiment of the present invention.

Referring to FIG. 1, it can be seen that a BICM device 10 and a BICM reception device 30 communicate with each other over a wireless channel 20.

The BICM device 10 generates an n-bit codeword by encoding k information bits 11 using an error-correction coder 13. In this case, the error-correction coder 13 may be an LDPC coder or a Turbo coder.

The codeword is interleaved by a bit interleaver 14, and thus the interleaved codeword is generated.

In this case, the interleaving may be performed on a bit group basis (by a unit of a bit group). In this case, the error-correction coder 13 may be an LDPC coder having a length of 64800 and a code rate of 2/15. A codeword having a length of 64800 may be divided into a total of 180 bit groups. Each of the bit groups may include 360 bits, i.e., the parallel factor of an LDPC codeword.

In this case, the interleaving may be performed on a bit group basis (by a unit of a bit group) in accordance with an interleaving sequence, which will be described later.

In this case, the bit interleaver 14 prevents the performance of error correction code from being degraded by effectively distributing burst errors occurring in a channel. In this case, the bit interleaver 14 may be separately designed in accordance with the length and code rate of the error correction code and the modulation order.

The interleaved codeword is modulated by a modulator 15, and is then transmitted via an antenna 17.

In this case, the modulator 15 may be based on a concept including symbol mapper (symbol mapping device). In this case, the modulator 15 may be a symbol mapping device performing 64-symbol mapping which maps codes onto 64 constellations (symbols).

In this case, the modulator 15 may be a uniform modulator, such as a quadrature amplitude modulation (QAM) modulator, or a non-uniform modulator.

The modulator 15 may be a symbol mapping device performing NUC (Non-Uniform Constellation) symbol mapping which uses 64 constellations (symbols).

The signal transmitted via the wireless channel 20 is received via the antenna 31 of the BICM reception device 30, and, in the BICM reception device 30, is subjected to a process reverse to the process in the BICM device 10. That is, the received data is demodulated by a demodulator 33, is deinterleaved by a bit deinterleaver 34, and is then decoded by an error correction decoder 35, thereby finally restoring the information bits.

It will be apparent to those skilled in the art that the above-described transmission and reception processes have been described within a minimum range required for a description of the features of the present invention and various processes required for data transmission may be added.

Figure 2:
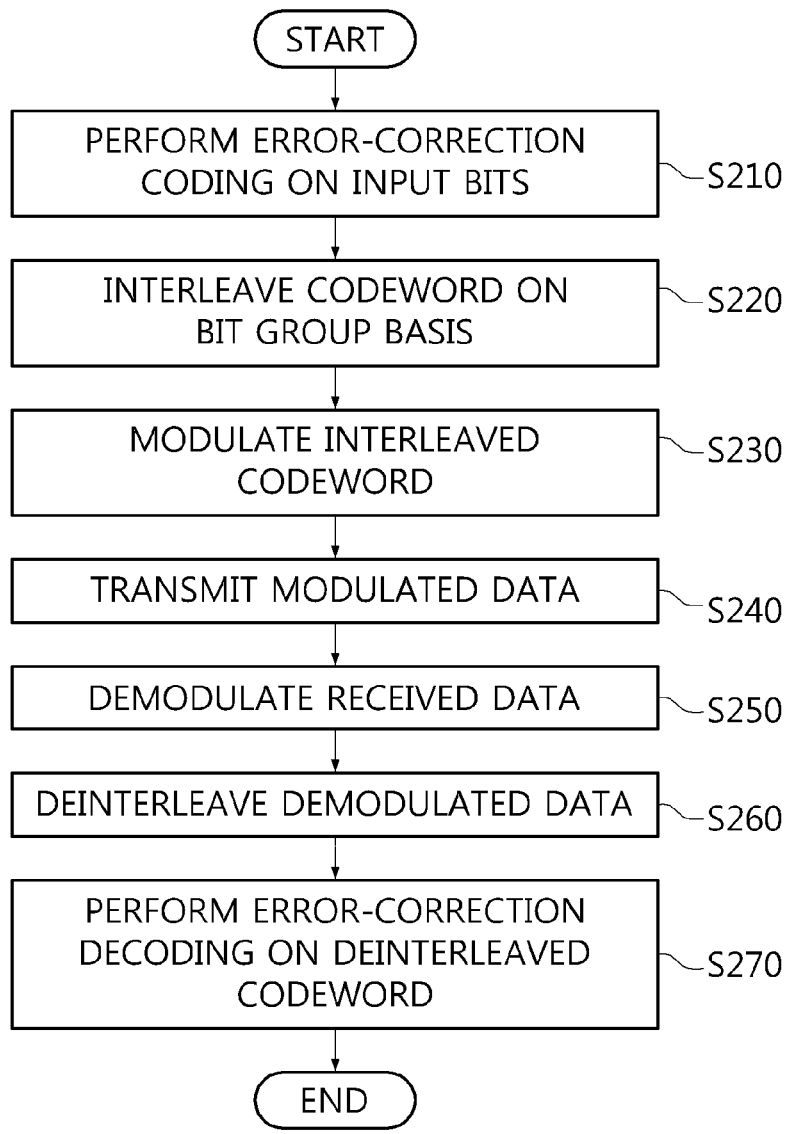
FIG. 2 is an operation flowchart illustrating a broadcast signal transmission and reception method according to an embodiment of the present invention.

FIG. 2 is an operation flowchart illustrating a broadcast signal transmission and reception method according to an embodiment of the present invention.

Referring to FIG. 2, in the broadcast signal transmission and reception method according to this embodiment of the present invention, input bits (information bits) are subjected to error-correction coding at step S210.

That is, at step S210, an n-bit codeword is generated by encoding k information bits using the error-correction coder.

In this case, step S210 may be performed as in an LDPC encoding method, which will be described later.

Furthermore, in the broadcast signal transmission and reception method, an interleaved codeword is generated by interleaving the n-bit codeword on a bit group basis at step S220.

In this case, the n-bit codeword may be an LDPC codeword having a length of 64800 and a code rate of 2/15. The codeword having a length of 64800 may be divided into a total of 180 bit groups. Each of the bit groups may include 360 bits corresponding to the parallel factors of an LDPC codeword.

In this case, the interleaving may be performed on a bit group basis (by a unit of a bit group) in accordance with an interleaving sequence, which will be described later.

Furthermore, in the broadcast signal transmission and reception method, the encoded data is modulated at step S230.

That is, at step S230, the interleaved codeword is modulated using the modulator.

In this case, the modulator may be based on a concept including symbol mapper (symbol mapping device). In this case, the modulator may be a symbol mapping device performing 64-symbol mapping which maps codes onto 64 constellations (symbols).

In this case, the modulator may be a uniform modulator, such as a QAM modulator, or a non-uniform modulator.

The modulator may be a symbol mapping device performing NUC (Non-Uniform Constellation) symbol mapping which uses 64 constellations (symbols).

Furthermore, in the broadcast signal transmission and reception method, the modulated data is transmitted at step S240.

That is, at step S240, the modulated codeword is transmitted over the wireless channel via the antenna.

Furthermore, in the broadcast signal transmission and reception method, the received data is demodulated at step S250.

That is, at step S250, the signal transmitted over the wireless channel is received via the antenna of the receiver, and the received data is demodulated using the demodulator.

Furthermore, in the broadcast signal transmission and reception method, the demodulated data is deinterleaved at step S260. In this case, the deinterleaving of step S260 may be reverse to the operation of step S220.

Furthermore, in the broadcast signal transmission and reception method, the deinterleaved codeword is subjected to error correction decoding at step S270.

That is, at step S270, the information bits are finally restored by performing error correction decoding using the error correction decoder of the receiver.

In this case, step S270 corresponds to a process reverse to that of an LDPC encoding method, which will be described later.

An LDPC code is known as a code very close to the Shannon limit for an additive white Gaussian noise (AWGN) channel, and has the advantages of asymptotically excellent performance and parallelizable decoding compared to a turbo code.

Generally, an LDPC code is defined by a low-density parity check matrix (PCM) that is randomly generated. However, a randomly generated LDPC code requires a large amount of memory to store a PCM, and requires a lot of time to access memory. In order to overcome these problems, a quasi-cyclic LDPC (QC-LDPC) code has been proposed. A QC-LDPC code that is composed of a zero matrix or a circulant permutation matrix (CPM) is defined by a PCM that is expressed by the following Equation 1:

$$H = \begin{bmatrix} J^{a_{11}} & J^{a_{12}} & \cdots & J^{a_{1n}} \\ J^{a_{21}} & J^{a_{22}} & \cdots & J^{a_{2n}} \\ \vdots & \vdots & \ddots & \vdots \\ J^{a_{m1}} & J^{a_{m2}} & \cdots & J^{a_{mn}} \end{bmatrix}, \text{ for } a_{ij} \in \{0, 1, \ldots, L-1, \infty\} \quad (1)$$

In this equation, J is a CPM having a size of L×L, and is given as the following Equation 2. In the following description, L may be 360.

$$J_{L \times L} = \begin{bmatrix} 0 & 1 & 0 & \cdots & 0 \\ 0 & 0 & 1 & \cdots & 0 \\ \vdots & \vdots & \vdots & \ddots & \vdots \\ 0 & 0 & 0 & \cdots & 1 \\ 1 & 0 & 0 & \cdots & 0 \end{bmatrix} \quad (2)$$

Furthermore, $J^i$ is obtained by shifting an L×L identity matrix I ($J^0$) to the right i (0≤i≤L) times, and $J^\infty$ is an L×L zero matrix. Accordingly, in the case of a QC-LDPC code, it is sufficient if only index exponent i is stored in order to store $J^i$, and thus the amount of memory required to store a PCM is considerably reduced.

Figure 3:
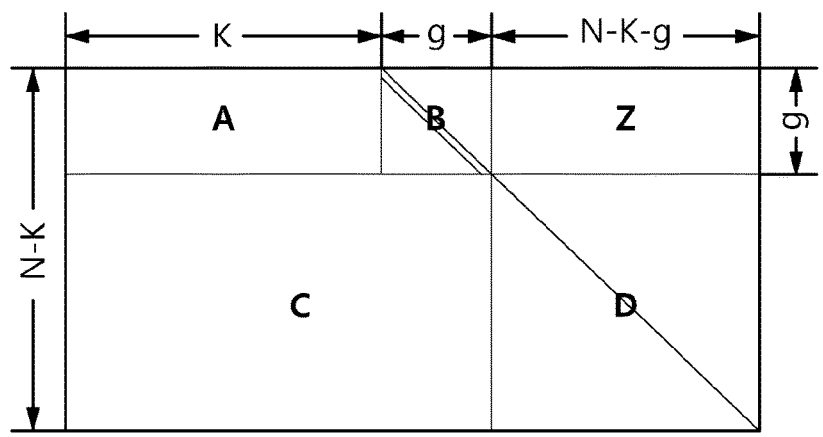
FIG. 3 is a diagram illustrating the structure of a parity check matrix (PCM) corresponding to an LDPC code to according to an embodiment of the present invention.

FIG. 3 is a diagram illustrating the structure of a PCM corresponding to an LDPC code to according to an embodiment of the present invention.

Referring to FIG. 3, the sizes of matrices A and C are g×K and (N−K−g)×(K+g), respectively, and are composed of an L×L zero matrix and a CPM, respectively. Furthermore, matrix Z is a zero matrix having a size of g×(N−K−g), matrix D is an identity matrix having a size of (N−K−g)×(N−K−g), and matrix B is a dual diagonal matrix having a size of g×g. In this case, the matrix B may be a matrix in which all elements except elements along a diagonal line and neighboring elements below the diagonal line are 0, and may be defined as the following Equation 3:

$$B_{g \times g} = \begin{bmatrix} I_{L \times L} & 0 & 0 & \cdots & 0 & 0 & 0 \\ I_{L \times L} & I_{L \times L} & 0 & \cdots & 0 & 0 & 0 \\ 0 & I_{L \times L} & I_{L \times L} & \vdots & 0 & 0 & 0 \\ \vdots & \vdots & \vdots & \ddots & \vdots & \vdots & \vdots \\ 0 & 0 & 0 & \cdots & I_{L \times L} & I_{L \times L} & 0 \\ 0 & 0 & 0 & \cdots & 0 & I_{L \times L} & I_{L \times L} \end{bmatrix} \quad (3)$$

where $I_{L \times L}$ is an identity matrix having a size of L×L.

That is, the matrix B may be a bit-wise dual diagonal matrix, or may be a blockwise dual diagonal matrix having identity matrices as its blocks, as indicated by Equation 3. The bit-wise dual diagonal matrix is disclosed in detail in Korean Patent Application Publication No. 2007-0058438, etc.

In particular, it will be apparent to those skilled in the art that when the matrix B is a bit-wise dual diagonal matrix, it is possible to perform conversion into a Quasi-cyclic form by applying row or column permutation to a PCM including the matrix B and having a structure illustrated in FIG. 3.

In this case, N is the length of a codeword, and K is the length of information.

The present invention proposes a newly designed QC-LDPC code in which the code rate thereof is 2/15 and the length of a codeword is 64800, as illustrated in the following Table 1. That is, the present invention proposes an LDPC code that is designed to receive information having a length of 8640 and generate an LDPC codeword having a length of 64800.

Table 1 illustrates the sizes of the matrices A, B, C, D and Z of the QC-LDPC code according to the present invention:

TABLE 1

| Code rate | Length | Sizes | | | | |
|---|---|---|---|---|---|---|
| | | A | B | C | D | Z |
| 2/15 | 64800 | 1800 × 8640 | 1800 × 1800 | 54360 × 10440 | 54360 × 54360 | 1800 × 54360 |

The newly designed LDPC code may be represented in the form of a sequence (progression), an equivalent relationship is established between the sequence and matrix (parity bit check matrix), and the sequence may be represented, as follows:

Sequence Table

1st row: 615 898 1029 6129 8908 10620 13378 14359 21964 23319 26427 26690 28128 33435 36080 40697 43525 44498 50994

-continued

Sequence Table

2nd row: 165 1081 1637 2913 8944 9639 11391 17341 22000 23580 32309 38495 41239 44079 47395 47460 48282 51744 52782
3rd row: 426 1340 1493 2261 10903 13336 14755 15244 20543 29822 35283 38846 45368 46642 46934 48242 49000 49204 53370
4th row: 407 1059 1366 2004 5985 9217 9321 13576 19659 20808 30009 31094 32445 39094 39357 40651 44358 48755 49732
5th row: 692 950 1444 2967 3929 6951 10157 10326 11547 13562 19634 34484 38236 42918 44685 46172 49694 50535 55109
6th row: 1087 1458 1574 2335 3248 6965 17856 23454 25182 37359 37718 37768 38061 38728 39437 40710 46298 50707 51572
7th row: 1098 1540 1711 7723 9549 9986 16369 19567 21185 21319 25750 32222 32463 40342 41391 43869 48372 52149 54722
8th row: 514 1283 1635 6602 11333 11443 17690 21036 22936 24525 25425 27103 28733 29551 39204 42525 49200 54899 54961
9th row: 357 609 1096 2954 4240 5397 8425 13974 15252 20167 20362 21623 27190 42744 47819 49096 51995 55504 55719
10th row: 25 448 1501 11572 13478 24338 29198 29840 31428 33088 34724 37698 37988 38297 40482 46953 47880 53751 54943
11st row: 328 1096 1262 10802 12797 16053 18038 20433 20444 25422 32992 34344 38326 41435 46802 48766 49807 52966 55751
12nd row: 34 790 987 5082 5788 10778 12824 18217 23278 24737 28312 34464 36765 37999 39603 40797 43237 53089 55319
13rd row: 226 1149 1470 3483 8949 9312 9773 13271 17804 20025 20323 30623 38575 39887 40305 46986 47223 49998 52111
14th row: 1088 1091 1757 2682 5526 5716 9665 10733 12997 14440 24665 27990 30203 33173 37423 38934 40494 45418 48393
15th row: 809 1278 1580 3486 4529 6117 6212 6823 7861 9244 11559 20736 30333 32450 35528 42968 44485 47149 54913
16th row: 369 525 1622 2261 6454 10483 11259 16461 17031 20221 22710 25137 26622 27904 30884 31858 44121 50690 56000
17th row: 423 1291 1352 7883 26107 26157 26876 27071 31515 35340 35953 36608 37795 37842 38527 41720 46206 47998 53019
18th row: 540 662 1433 2828 14410 22880 24263 24802 28242 28396 35928 37214 39748 43915 44905 46590 48684 48890 55926
19th row: 214 1291 1622 7311 8985 20952 22752 23261 24896 25057 28826 37074 37707 38742 46026 51116 51521 52956 54213
20th row: 109 1305 1676 2594 7447 8943 14806 16462 19730 23430 24542 34300 36432 37133 41199 43942 45860 47598 48401 49407
21st row: 242 388 1360 6721 14220 21029 22536 25126 32251 33182 39192 42436 44144 45252 46238 47369 47607 47695 50635 51469
22nd row: 199 958 1111 13661 18809 19234 21459 25221 25837 28256 36919 39031 39107 39262 43572 45018 45959 48006 52387 55811
23rd row: 668 1087 1451 2945 3319 12519 21248 21344 22627 22701 28152 29670 31430 32655 38533 42233 43200 44013 44459 51398
24th row: 244 1133 1665 8222 8740 11285 12774 15922 20147 20978 28927 35086 40197 40583 41066 41223 42104 44650 45391 48437
25th row: 5623 8050 9679 12978 15846 16049 21807 23364 27226 27758 28661 38147 46337 48141 51364 51927 55124
26th row: 10369 13704 14491 18632 19430 21218 33392 36182 36722 37342 37415 46322 47449 51136 53392 54356 55108
27th row: 7460 9411 11132 11739 13722 15501 25588 26463 26738 31980 31981 35002 39659 39783 41581 51358 55114
28th row: 8915 15253 15264 16513 16896 18367 19110 23492 32074 33302 42443 43797 44715 47538 48515 53464 53548
29th row: 5884 8910 10123 11311 13654 14207 16122 18113 23100 23784 24825 39629 46372 52454 52799 55039 55973

An LDPC code that is represented in the form of a sequence is being widely used in the DVB standard.

According to an embodiment of the present invention, an LDPC code presented in the form of a sequence is encoded, as follows. It is assumed that there is an information block $S=(s_0, s_1, \ldots, s_{K-1})$ having an information size K. The LDPC encoder generates a codeword $\Lambda=(\lambda_0, \lambda_1, \lambda_2, \ldots, \lambda_{N-1})$ having a size of $N=K+M_1+M_2$ using the information block S having a size K. In this case, $M_1=g$, and $M_2=N-K-g$. Furthermore, $M_1$ is the size of parity bits corresponding to the dual diagonal matrix B, and $M_2$ is the size of parity bits corresponding to the identity matrix D. The encoding process is performed, as follows:

Initialization:

$\lambda_i = s_i$ for $i=0,1,\ldots,K-1$ $p_j=0$ for $j=0,1,\ldots,M_1+M_2-1$     (4)

First information bit $\lambda_0$ is accumulated at parity bit addresses specified in the 1st row of the sequence of the Sequence Table. For example, in an LDPC code having a length of 64800 and a code rate of 2/15, an accumulation process is as follows:

$p_{615}=p_{615} \oplus \lambda_0 \ p_{898}=p_{898} \oplus \lambda_0 \ p_{1029}=p_{1029} \oplus \lambda_0$
$p_{6129}=p_{6129} \oplus \lambda_0 \ p_{8908}=p_{8908} \oplus \lambda_0$ $p_{10620}=p_{10620} \oplus \lambda_0 \ p_{13378}=p_{13378} \oplus \lambda_0$
$p_{14359}=p_{14359} \oplus \lambda_0 \ p_{21964}=p_{21964} \oplus \lambda_0$
$p_{23319}=p_{23319} \oplus \lambda_0$ $$p_{26427} = p_{26427} \oplus \lambda_0 \, p_{26690} = p_{26690} \oplus \lambda_0$$
$$p_{28128} = p_{28128} \oplus \lambda_0 \, p_{33435} = p_{33435} \oplus \lambda_0$$
$$p_{36080} = p_{36080} \oplus \lambda_0$$

$$p_{40697} = p_{40697} \oplus \lambda_0 \, p_{43525} = p_{43525} \oplus \lambda_0$$
$$p_{44498} = p_{44498} \oplus \lambda_0 \, p_{50994} = p_{50994} \oplus \lambda_0$$

where the addition $\oplus$ occurs in GF(2).

The subsequent L−1 information bits, that is, $\lambda_m$, m=1, 2, . . . , L−1, are accumulated at parity bit addresses that are calculated by the following Equation 5:

$$(x + m \times Q_1) \bmod M_1 \text{ if } x < M_1$$
$$M_1 + \{(x - M_1 + m \times Q_2) \bmod M_2\} \text{ if } x \geq M_1 \quad (5)$$

where x denotes the addresses of parity bits corresponding to the first information bit $\lambda_0$, that is, the addresses of the parity bits specified in the first row of the sequence of the Sequence Table, $Q_1 = M_1/L$, $Q_2 = M_2/L$, and L=360. Furthermore, $Q_1$ and $Q_2$ are defined in the following Table 2. For example, for an LDPC code having a length of 64800 and a code rate of 2/15, $M_1 = 1800$, $Q_1 = 5$, $M_2 = 54360$, $Q_2 = 151$ and L=360, and the following operations are performed on the second bit $\lambda_1$ using Equation 5:

$$p_{620} = p_{620} \oplus \lambda_1 \, p_{903} = p_{903} \oplus \lambda_1 \, p_{1034} = p_{1034} \oplus \lambda_1$$
$$p_{6280} = p_{6280} \oplus \lambda_1 \, p_{9059} = p_{9059} \oplus \lambda_1$$

$$p_{10771} = p_{10771} \oplus \lambda_1 \, p_{13529} = p_{13529} \oplus \lambda_1$$
$$p_{14510} = p_{14510} \oplus \lambda_1 \, p_{22115} = p_{22115} \oplus \lambda_1$$
$$p_{23470} = p_{23470} \oplus \lambda_1$$

$$p_{26578} = p_{26578} \oplus \lambda_1 \, p_{26841} = p_{26841} \oplus \lambda_1$$
$$p_{28279} = p_{28279} \oplus \lambda_1 \, p_{33586} = p_{33586} \oplus \lambda_1$$
$$p_{36231} = p_{36231} \oplus \lambda_1$$

$$p_{40848} = p_{40848} \oplus \lambda_1 \, p_{43676} = p_{43676} \oplus \lambda_1 \, p_{44649} =$$
$$p_{44649} \oplus \lambda_1 \, p_{51145} = p_{51145} \oplus \lambda_1$$

Table 2 illustrates the sizes of $M_1$, $Q_1$, $M_2$ and $Q_2$ of the designed QC-LDPC code:

TABLE 2

| | | Sizes | | | |
|---|---|---|---|---|---|
| Code rate | Length | $M_1$ | $M_2$ | $Q_1$ | $Q_2$ |
| 2/15 | 64800 | 1800 | 54360 | 5 | 151 |

The addresses of parity bit accumulators for new 360 information bits from $\lambda_L$ to $\lambda_{2L-1}$ are calculated and accumulated from Equation 5 using the second row of the sequence.

In a similar manner, for all groups composed of new L information bits, the addresses of parity bit accumulators are calculated and accumulated from Equation 5 using new rows of the sequence.

After all the information bits from $\lambda_0$ to $\lambda_{K-1}$ have been exhausted, the operations of the following Equation 6 are sequentially performed from i=1:

$$p_i = p_i \oplus p_{i-1} \text{ for } i = 0, 1, \ldots, M_1 - 1 \quad (6)$$

Thereafter, when a parity interleaving operation, such as that of the following Equation 7, is performed, parity bits corresponding to the dual diagonal matrix B are generated:

$$\lambda_{K+L \cdot t+s} = p_{Q_1 \cdot s + t} \text{ for } 0 \leq s < L, \, 0 \leq t < Q_1 \quad (7)$$

When the parity bits corresponding to the dual diagonal matrix B have been generated using K information bits $\lambda_0$, $\lambda_1, \ldots, \lambda_{K-1}$, parity bits corresponding to the identity matrix D are generated using the $M_1$ generated parity bits $\lambda_K$, $\lambda_{K+1}, \ldots, \lambda_{K+M_1-1}$.

For all groups composed of L information bits from $\lambda_K$ to $\lambda_{K+M_1-1}$, the addresses of parity bit accumulators are calculated using the new rows (starting with a row immediately subsequent to the last row used when the parity bits corresponding to the dual diagonal matrix B have been generated) of the sequence and Equation 5, and related operations are performed.

When a parity interleaving operation, such as that of the following Equation 8, is performed after all the information bits from $\lambda_K$ to $\lambda_{K+M_1-1}$ have been exhausted, parity bits corresponding to the identity matrix D are generated:

$$\lambda_{K+M_1+L \cdot t+s} = p_{M_1+Q_2 \cdot s+t} \text{ for } 0 \leq s < L, \, 0 \leq t < Q_2 \quad (8)$$

Figure 4:
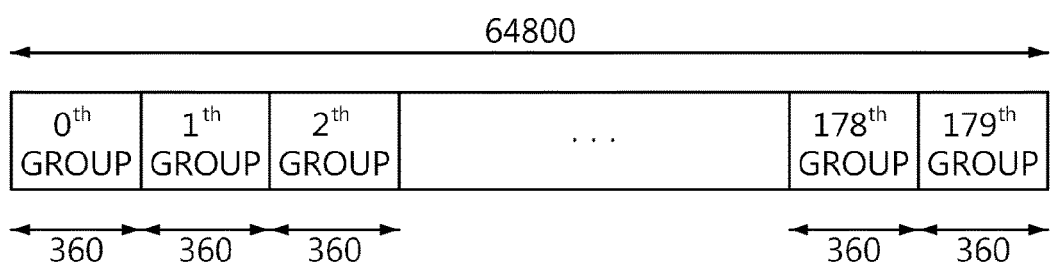
FIG. 4 is a diagram illustrating the bit groups of an LDPC codeword having a length of 64800.

FIG. 4 is a diagram illustrating the bit groups of an LDPC codeword having a length of 64800.

Referring to FIG. 4, it can be seen that an LDPC codeword having a length of 64800 is divided into 180 bit groups (a 0th group to a 179th group).

In this case, 360 may be the parallel factor (PF) of the LDPC codeword. That is, since the PF is 360, the LDPC codeword having a length of 64800 is divided into 180 bit groups, as illustrated in FIG. 4, and each of the bit groups includes 360 bits.

Figure 5:
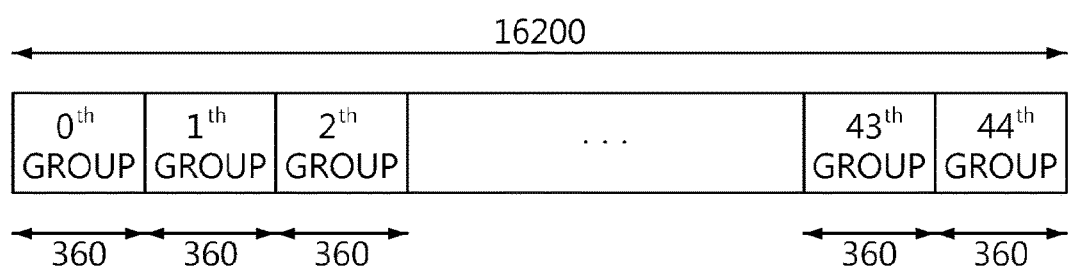
FIG. 5 is a diagram illustrating the bit groups of an LDPC codeword having a length of 16200.

FIG. 5 is a diagram illustrating the bit groups of an LDPC codeword having a length of 16200.

Referring to FIG. 5, it can be seen that an LDPC codeword having a length of 16200 is divided into 45 bit groups (a 0th group to a 44th group).

In this case, 360 may be the parallel factor (PF) of the LDPC codeword. That is, since the PF is 360, the LDPC codeword having a length of 16200 is divided into 45 bit groups, as illustrated in FIG. 5, and each of the bit groups includes 360 bits.

Figure 6:
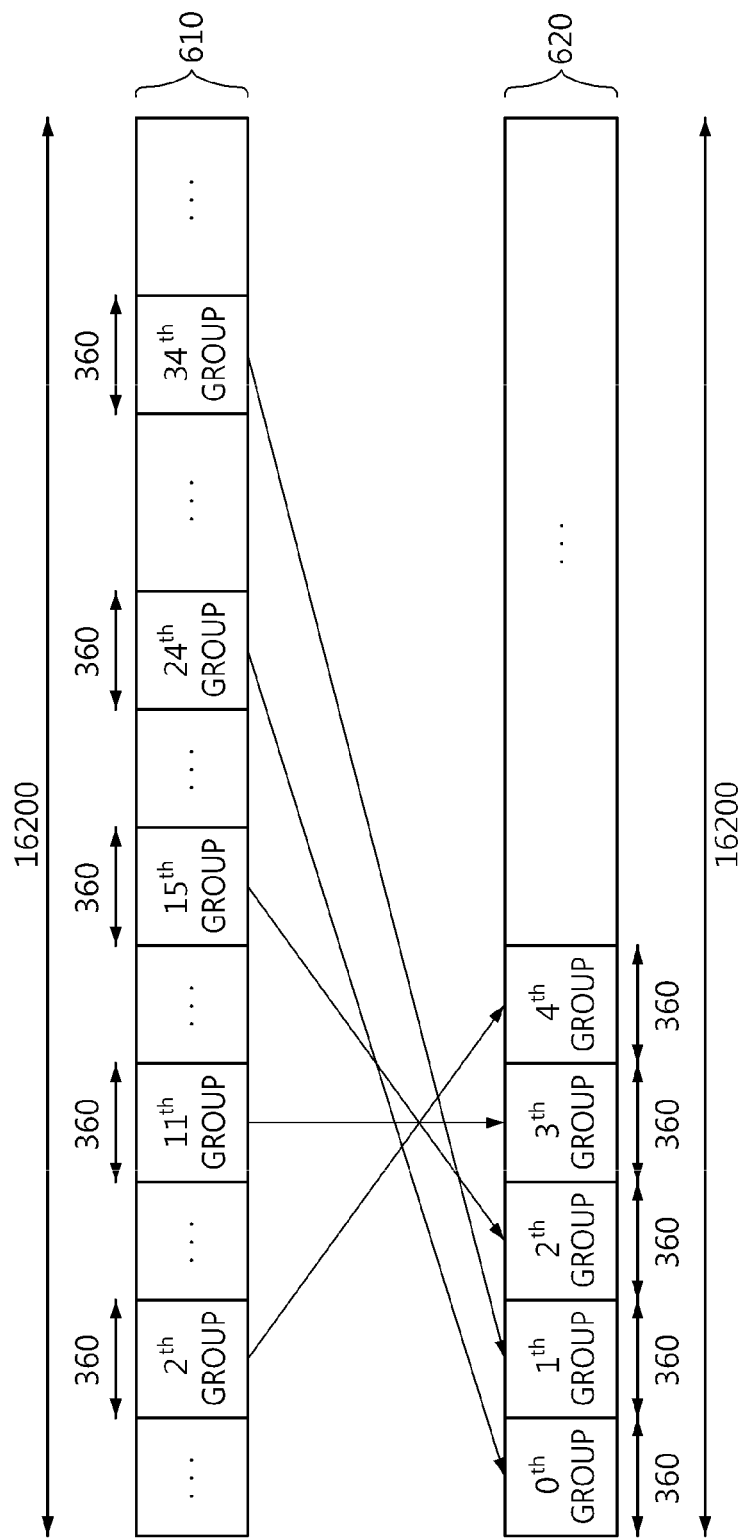
FIG. 6 is a diagram illustrating interleaving that is performed on a bit group basis in accordance with an interleaving sequence.

FIG. 6 is a diagram illustrating interleaving that is performed on a bit group basis in accordance with an interleaving sequence.

Referring to FIG. 6, it can be seen that interleaving is performed by changing the order of bit groups by a designed interleaving sequence.

For example, it is assumed that an interleaving sequence for an LDPC codeword having a length of 16200 is as follows:

interleaving sequence={24 34 15 11 2 28 17 25 5 38 19 13 6 39 1 14 33 37 29 12 42 31 30 32 36 40 26 35 44 4 16 8 20 43 21 7 0 18 23 3 10 41 9 27 22}

Then, the order of the bit groups of the LDPC codeword illustrated in FIG. 4 is changed into that illustrated in FIG. 6 by the interleaving sequence.

That is, it can be seen that each of the LDPC codeword 610 and the interleaved codeword 620 includes 45 bit groups, and it can be also seen that, by the interleaving sequence, the 24th bit group of the LDPC codeword 610 is changed into the 0th bit group of the interleaved LDPC codeword 620, the 34th bit group of the LDPC codeword 610 is changed into the 1st bit group of the interleaved LDPC codeword 620, the 15th bit group of the LDPC codeword 610 is changed into the 2nd bit group of the interleaved LDPC codeword 620, and the 1st bit group of the LDPC codeword 610 is changed into the 3rd bit group of the interleaved LDPC codeword 620, and the 2nd bit group of the LDPC codeword 610 is changed into the 4th bit group of the interleaved LDPC codeword 620.

An LDPC codeword ($u_0, u_1, \ldots, u_{N_{ldpc}-1}$) having a length of $N_{ldpc}$ is divided into $N_{group} = N_{ldpc}/360$ bit groups, as in Equation 9 below:

$$X_j = \{u_k | 360 \times j \leq k < 360 \times (j+1), \, 0 \leq k < N_{ldpc}\} \text{ for } 0 \leq j < N_{group} \quad (9)$$

where $X_j$ is an j-th bit group, and each $X_j$ is composed of 360 bits.

The LDPC codeword divided into the bit groups is interleaved, as in Equation 10 below:

$$Y_j = X_{\pi(j)} \quad 0 \leq j \leq N_{group} \tag{10}$$

where $Y_j$ is an interleaved j-th bit group, and π(j) is a permutation order for bit group-based interleaving (bit group-unit interleaving). The permutation order corresponds to the interleaving sequence of Equation 11 below:

interleaving sequence={57 149 83 142 29 20 30 52
5 100 156 22 130 167 121 126 137 158 132 82
138 128 89 88 162 32 107 3 97 166 125 129 1
6 68 148 40 87 0 80 49 24 78 101 43 112 75
172 23 154 12 146 19 135 48 170 123 147 95
91 13 35 127 61 60 139 44 59 55 109 157 177
153 165 66 152 77 98 131 11 81 62 175 141
171 51 155 76 150 174 58 143 37 63 31 41
140 118 94 27 10 70 56 93 176 124 151 106
46 163 179 4 18 144 178 161 145 71 114 7
105 133 84 86 17 21 28 54 74 65 110 122 169
64 111 119 42 85 73 8 116 79 120 69 53 115
67 104 16 173 92 15 159 134 99 96 117 38 9
26 164 47 103 113 136 168 102 14 45 72 25
50 34 36 90 160 2 33 39 108} (11)

That is, when each of the codeword and the interleaved codeword includes 180 bit groups ranging from a 0th bit group to a 179th bit group, the interleaving sequence of Equation 11 means that the 57th bit group of the codeword becomes the 0th bit group of the interleaved codeword, the 149th bit group of the codeword becomes the 1st bit group of the interleaved codeword, the 83th bit group of the codeword becomes the 2nd bit group of the interleaved codeword, the 142th bit group of the codeword becomes the 3rd bit group of the interleaved codeword, . . . , the 39th bit group of the codeword becomes the 178th bit group of the interleaved codeword, and the 108th bit group of the codeword becomes the 179th bit group of the interleaved codeword.

In particular, the interleaving sequence of Equation 11 has been optimized for a case where 64-symbol mapping (NUC symbol mapping) is employed and an LDPC coder having a length of 64800 and a code rate of 2/15 is used.

Figure 7:
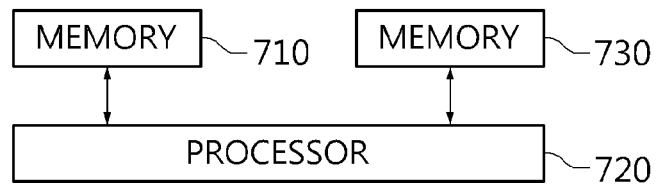
FIG. 7 is a block diagram illustrating a bit interleaver according to an embodiment of the present invention.

FIG. 7 is a block diagram illustrating a bit interleaver according to an embodiment of the present invention.

Referring to FIG. 7, the bit interleaver according to the present embodiment includes memories 710 and 730 and a processor 720.

The memory 710 stores an LDPC codeword having a length of 64800 and a code rate of 2/15.

The processor 720 generates an interleaved codeword by interleaving the LDPC codeword on a bit group basis corresponding to the parallel factor of the LDPC codeword.

In this case, the parallel factor may be 360. In this case, each of the bit groups may include 360 bits.

In this case, the LDPC codeword may be divided into 180 bit groups, as in Equation 9.

In this case, the interleaving may be performed using Equation 10 using permutation order.

In this case, the permutation order may correspond to the interleaving sequence represented by Equation 11.

The memory 730 provides the interleaved codeword to a modulator for 64-symbol mapping.

In this case, the modulator may be a symbol mapping device performing NUC (Non-Uniform Constellation) symbol mapping.

The memories 710 and 730 may correspond to various types of hardware for storing a set of bits, and may correspond to a data structure, such as an array, a list, a stack, a queue or the like.

In this case, the memories 710 and 730 may not be physically separate devices, but may correspond to different addresses of a physically single device. That is, the memories 710 and 730 are not physically distinguished from each other, but are merely logically distinguished from each other.

The error-correction coder 13 illustrated in FIG. 1 may be implemented in the same structure as in FIG. 7.

That is, the error-correction coder may include memories and a processor. In this case, the first memory is a memory that stores an LDPC codeword having a length of 64800 and a code rate of 2/15, and a second memory is a memory that is initialized to 0.

The memories may correspond to $\lambda_i$(i=0, 1, . . . , N−1) and $P_j$(j=0, 1, . . . , $M_1+M_2-1$), respectively.

The processor may generate an LDPC codeword corresponding to information bits by performing accumulation with respect to the memory using a sequence corresponding to a parity check matrix (PCM).

In this case, the accumulation may be performed at parity bit addresses that are updated using the sequence of the above Sequence Table.

In this case, the LDPC codeword may include a systematic part $\lambda_0, \lambda_1, \ldots, \lambda_{K-1}$ corresponding to the information bits and having a length of 8640 (=K), a first parity part $\lambda_K, \lambda_{K+1}, \ldots, \lambda_{K+M_1-1}$ corresponding to a dual diagonal matrix included in the PCM and having a length of 1800 (=$M_1$=g), and a second parity part $\lambda_{K+M_1}, \lambda_{K+M_1-1}$ corresponding to an identity matrix included in the PCM and having a length of 54360 (=$M_2$).

In this case, the sequence may have a number of rows equal to the sum (8640/360+1800/360=29) of a value obtained by dividing the length of the systematic part, i.e., 8640, by a CPM size L corresponding to the PCM, i.e., 360, and a value obtained by dividing the length $M_1$ of the first parity part, i.e., 1800, by 360.

As described above, the sequence may be represented by the above Sequence Table.

In this case, the second memory may have a size corresponding to the sum $M_1+M_2$ of the length $M_1$ of the first parity part and the length $M_2$ of the second parity part.

In this case, the parity bit addresses may be updated based on the results of comparing each x of the previous parity bit addresses, specified in respective rows of the sequence, with the length $M_1$ of the first parity part.

That is, the parity bit addresses may be updated using Equation 5. In this case, x may be the previous parity bit addresses, m may be an information bit index that is an integer larger than 0 and smaller than L, L may be the CPM size of the PCM, $Q_1$ may be $M_1/L$, $M_1$ may be the size of the first parity part, $Q_2$ may be $M_2/L$, and $M_2$ may be the size of the second parity part.

In this case, it may be possible to perform the accumulation while repeatedly changing the rows of the sequence by the CPM size L (=360) of the PCM, as described above.

In this case, the first parity part $\lambda_K, \lambda_{K+1}, \ldots, \lambda_{K+M_1-1}$ may be generated by performing parity interleaving using the first memory and the second memory, as described in conjunction with Equation 7.

In this case, the second parity part $\lambda_{K+M_1}, \lambda_{K+M_1+1}, \ldots, \lambda_{K+M_1+M_2-1}$ may be generated by performing parity interleaving using the first memory and the second memory after generating the first parity part $\lambda_K, \lambda_{K+1}, \ldots, \lambda_{K+M_1-1}$ and then performing the accumulation using the first parity part $\lambda_K, \lambda_{K+1}, \ldots, \lambda_{K+M_1-1}$ and the sequence, as described in conjunction with Equation 8.

Figure 8:
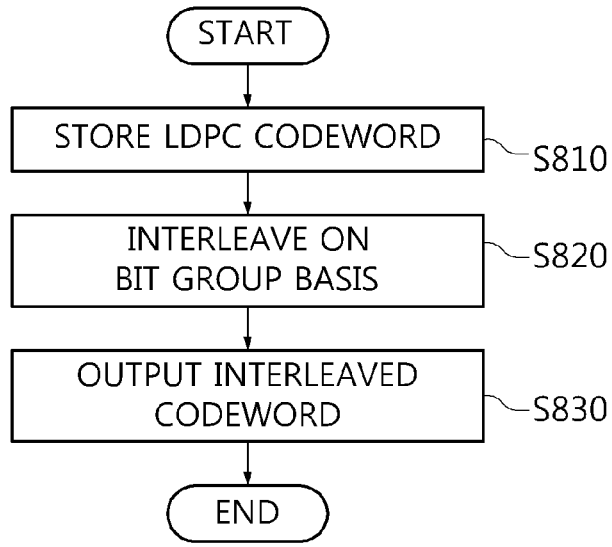
FIG. 8 is an operation flowchart illustrating a bit interleaving method according to an embodiment of the present invention.

FIG. 8 is an operation flowchart illustrating a bit interleaving method according to an embodiment of the present invention.

Referring to FIG. 8, in the bit interleaving method according to the present embodiment, an LDPC codeword having a length of 64800 and a code rate of 2/15 is stored at step S810.

In this case, the LDPC codeword may be represented by $(u_0, u_1, \ldots, u_{N_{ldpc}-1})$ (where $N_{ldpc}$ is 64800), and may be divided into 180 bit groups each composed of 360 bits, as in Equation 9.

Furthermore, in the bit interleaving method according to the present embodiment, an interleaved codeword is generated by interleaving the LDPC codeword on a bit group basis at step S820.

In this case, the size of the bit group may correspond to the parallel factor of the LDPC codeword.

In this case, the interleaving may be performed using Equation 10 using permutation order.

In this case, the permutation order may correspond to the interleaving sequence represented by Equation 11.

In this case, the parallel factor may be 360, and each of the bit groups may include 360 bits.

In this case, the LDPC codeword may be divided into 180 bit groups, as in Equation 9.

Moreover, in the bit interleaving method according to the present embodiment, the interleaved codeword is output to a modulator for 64-symbol mapping at step 830.

In accordance with at least one embodiment of the present invention, there is provided an intra-BICM bit interleaver that can effectively distribute burst errors occurring in a broadcasting system channel.

In accordance with at least one embodiment of the present invention, there is provided a bit interleaver that is optimized for an LDPC coder having a length of 64800 and a code rate of 2/15 and a modulator performing 64-symbol mapping and, thus, can be applied to next-generation broadcasting systems, such as ATSC 3.0.

Although the specific embodiments of the present invention have been disclosed for illustrative purposes, those skilled in the art will appreciate that various modifications, additions and substitutions are possible without departing from the scope and spirit of the invention as disclosed in the accompanying claims.

What is claimed is:

1. A bit-interleaved coded modulation (BICM) device, comprising:
a receiving unit configured to receive a broadcast signal transmitted over a physical channel, the broadcast signal being generated by interleaving a low-density parity check (LDPC) codeword having a length of 64800 and a code rate of 2/15 and performing 64-symbol mapping corresponding to the interleaved codeword;
a demodulator configured to perform demodulation corresponding to the 64-symbol mapping for the received broadcast signal;
a deinterleaver configured to perform group-unit deinterleaving on interleaved values, the interleaved values generated after the demodulation; and
an error-correction decoder configured to reconstruct information bits by LDPC-decoding deinterleaved values generated based on the group-unit deinterleaving, the deinterleaved values corresponding to the LDPC codeword,
wherein the group-unit deinterleaving is performed on a group basis and corresponds to a reverse process of a bit group-unit interleaving for the LDPC codeword, the size of the group corresponding to a parallel factor of the LDPC codeword,
wherein the bit group-unit interleaving is performed using the following equation using permutation order:

$Y_j = X_{\pi(j)}, 0 \leq j < N_{group}$ where $X_{\pi(j)}$ is a $\pi(j)$th bit group, $Y_j$ is an interleaved j-th bit group, and $\pi(j)$ is a permutation order for the bit group unit interleaving,
wherein the permutation order corresponds to an interleaving sequence, the interleaving sequence being for the LDPC codeword having the length of 64800 and the code rate of 2/15 and being represented by the following interleaving sequence ={57 149 83 142 29 20 30 52 5 100 156 22 130
167 121 126 137 158 132 82 138 128 89 88
162 32 107 3 97 166 125 129 1 6 68 148 40 87
0 80 49 24 78 101 43 112 75 172 23 154 12
146 19 135 48 170 123 147 95 91 13 35 127
61 60 139 44 59 55 109 157 177 153 165 66
152 77 98 131 11 81 62 175 141 171 51 155
76 150 174 58 143 37 63 31 41 140 118 94 27
10 70 56 93 176 124 151 106 46 163 179 4 18
144 178 161 145 71 114 7 105 133 84 86 17
21 28 54 74 65 110 122 169 64 111 119 42 85
73 8 116 79 120 69 53 115 67 104 16 173 92
15 159 134 99 96 117 38 9 26 164 47 103 113
136 168 102 14 45 72 25 50 34 36 90 160 2 33
39 108}, and wherein the bit group-unit interleaving is performed before performing the 64-symbol mapping so as to distribute burst errors occurring in the broadcast signal transmitted over the physical channel.

2. The BICM device of claim 1, wherein the 64-symbol mapping is a Non-Uniform Constellation (NUC) symbol mapping which corresponds to 64 constellations.

* * * * *